(12) United States Patent
Huang et al.

(10) Patent No.: US 7,545,045 B2
(45) Date of Patent: Jun. 9, 2009

(54) DUMMY VIA FOR REDUCING PROXIMITY EFFECT AND METHOD OF USING THE SAME

(75) Inventors: Kun-Cheng Huang, Puyah Township (TW); Huan-Chi Tseng, Hsinchu (TW); Jhy-Chen You, Hsinchu (TW); Kuan-Miao Liu, Shulin (TW); Tsong-Yuan Chen, Jhubei (TW); Chih-Yang Wang, Chiayi (TW); Tin-Lin Tsai, Tainan (TW); Ssu-Chia Huang, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 11/087,863

(22) Filed: Mar. 24, 2005

(65) Prior Publication Data

US 2006/0214298 A1      Sep. 28, 2006

(51) Int. Cl.
*H01L 29/40* (2006.01)
(52) U.S. Cl. ............... 257/774; 257/621; 257/E21.597; 257/E21.577; 257/E21.578; 438/629; 438/668; 438/672
(58) Field of Classification Search ................. 438/667, 438/629, 630, 637–640, 668, 672, 675; 257/E21.579, 257/E21.597, E21.577, E21.578, E21.585, 257/E21.586, 774, 734, 773
See application file for complete search history.

(56) References Cited

U.S. PATENT DOCUMENTS

| | | | |
|---|---|---|---|
| 6,660,619 B1 * | 12/2003 | Pangrle et al. | 438/586 |
| 6,787,454 B1 * | 9/2004 | Saito | 438/637 |
| 2002/0079585 A1 * | 6/2002 | Wong | 257/758 |
| 2002/0173105 A1 * | 11/2002 | Park et al. | 438/279 |
| 2003/0170978 A1 * | 9/2003 | Lee | 438/638 |
| 2004/0084761 A1 * | 5/2004 | Karthikeyan et al. | 257/700 |
| 2004/0266184 A1 * | 12/2004 | RamachandraRao et al. | 438/689 |
| 2005/0035457 A1 * | 2/2005 | Tomita et al. | 257/758 |
| 2005/0106886 A1 * | 5/2005 | Goodner et al. | 438/706 |
| 2006/0012052 A1 * | 1/2006 | McDevitt et al. | 257/778 |
| 2006/0029879 A1 * | 2/2006 | Flanigan et al. | 430/141 |

FOREIGN PATENT DOCUMENTS

CN    1442896 A    9/2003

OTHER PUBLICATIONS

General definition of "Low K dielectric" www.wikipedia.org, Search word low K.*
Definition of low-k dielectric by http://semiconductorglossary.com: search work: low-k.*
Chinese Office Action for 2006100023526.

* cited by examiner

*Primary Examiner*—W. David Coleman
*Assistant Examiner*—Su C Kim
(74) *Attorney, Agent, or Firm*—Birch, Stewart, Kolasch & Birch, LLP

(57) ABSTRACT

A dummy via design for a dual damascene structure has a dielectric layer on a substrate, a dual damascene structure filled with a conductive material and inlaid in the dielectric layer, and a dummy via structure filled with a non-conductive material and inlaid in the dielectric layer. The dummy via structure has at least two dummy vias filled with the non-conductive material and located adjacent to two sides of the dual damascene structure respectively.

8 Claims, 4 Drawing Sheets

DUMMY VIA FOR REDUCING PROXIMITY EFFECT AND METHOD OF USING THE SAME

TECHNICAL FIELD

The present invention relates to integrated circuit interconnection, and particularly to a dual damascene structure and a via-first dual damascene process of forming the same.

BACKGROUND

Microelectronic integrated circuits (ICs) based on patterned semiconductor materials are continuing to evolve towards devices with an extremely high density of circuit elements per unit volume. The use of copper (Cu), with twice the conductivity of aluminum and three times the conductivity of tungsten, has been replaced as the interconnect material in advanced ICs manufacture using either single inlay or dual damascene processes. The conventional method of patterning trenches in a via-first dual damascene process involves filling via openings with an organic bottom anti-reflective coating (BARC), applying a photoresist layer on the via plug and then performing trench lithography. The via-first dual damascene process is considered superior in terms of reliable connection to the underlying metal, but has via proximity effect that causes difference in via CD (critical dimension).

In the semiconductor manufacturing art, the resolutions obtainable using optical lithography techniques is limited by what is known in the art as "proximity effects", resulting in variations in feature of line width, alterations in pattern shapes, closed contacts or holes, and shortened or rounded lines among other distortions. Arising from proximity effects, the vias having difference critical dimensions, depending on their different pitches, usually occur and thereby cause defects. For example, a bird's beak is observed in a relative large via, and a blind via is observed in a relative small via. The most common technique to alleviate proximity effects is the use of optical proximity correction (OPC), which utilizes the addition of enlarged features on the mask pattern so as to anticipate and correct for the proximity effects. The OPC technique, however, is limited by the size of the added shapes. For compensating the via proximity effect, the use of OPC technique is difficult to make different-pitch vias obtain an identical via CD.

Therefore, a method of alleviating proximity effects without the use of OPC technique is desired for the via-first dual damascene process. There remains, however, a need for a novel approach that affords an increased process window for the via patterning process.

SUMMARY OF THE INVENTION

Embodiments of the present invention include a dummy via design for an interconnection process, which builds a similar environment for various vias with different pitches to reduce via proximity effects and enlarge process window.

In one aspect, the present invention provides a semiconductor device has a dielectric layer on a substrate, a dual damascene structure filled with a conductive material and inlaid in the dielectric layer, and a dummy via structure filled with a non-conductive material and inlaid in the dielectric layer. The dummy via structure has at least two dummy vias filled with the non-conductive material and located adjacent to two sides of the dual damascene structure respectively.

In another aspect, the present invention provides a method of forming dummy vias. A dielectric layer is on a semiconductor substrate. At least one first opening and at least two second openings are formed in the dielectric layer, wherein the second openings are located adjacent to two sides of the first opening respectively. A nonconductive material is provided to fill aid first opening and the second openings. By removing a part of the dielectric layer around the first opening and a part of the non-conductive material in the first opening, a trench opening is formed on the upper region of the first opening. By removing the non-conductive material from the lower region of the first opening, a via opening is formed under the trench opening. A conductive material is then provided to fill the trench opening and the via opening.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF ILLUSTRATIVE EMBODIMENTS

Figure 1A:
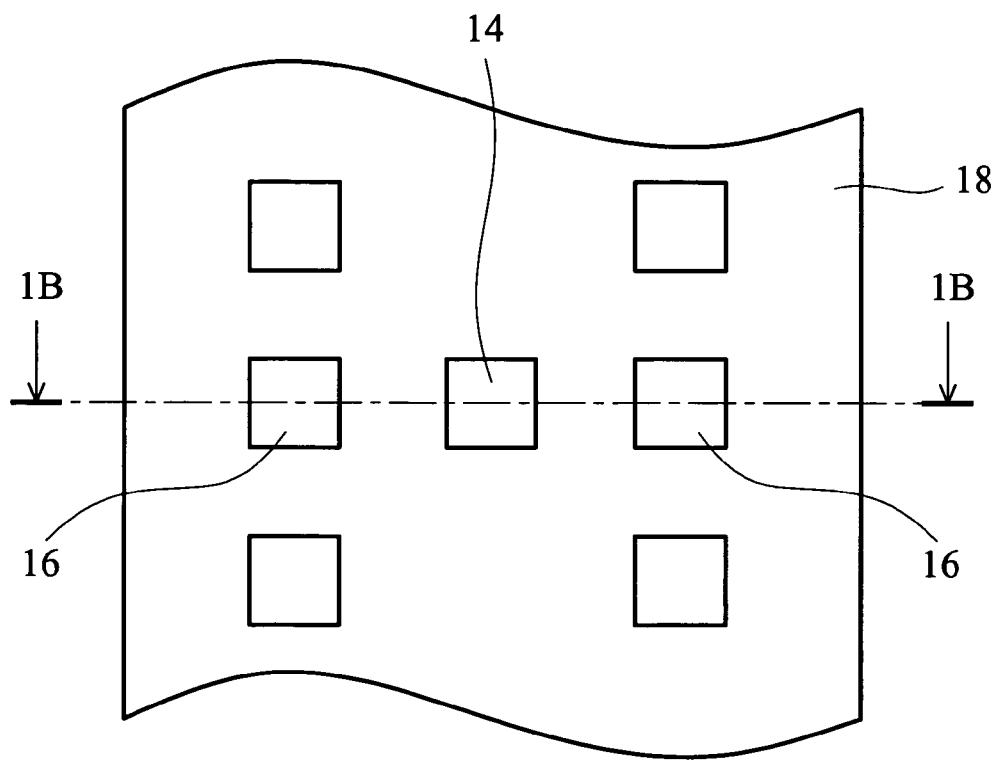
FIG. 1A is a plane view illustrating an exemplary embodiment of a dummy via design.

The present invention provide a dummy via design for an interconnection process, which builds a similar environment for various vias with different pitches to reduce via proximity effects and enlarge process window, thus overcoming the aforementioned problems of the prior art arising from the use of OPC technique. As will be appreciated by persons skilled in the art from discussion herein, one application is used for a dual damascene process, preferably a via-first dual damascene process, and the other application is used for a contact process.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 1B:
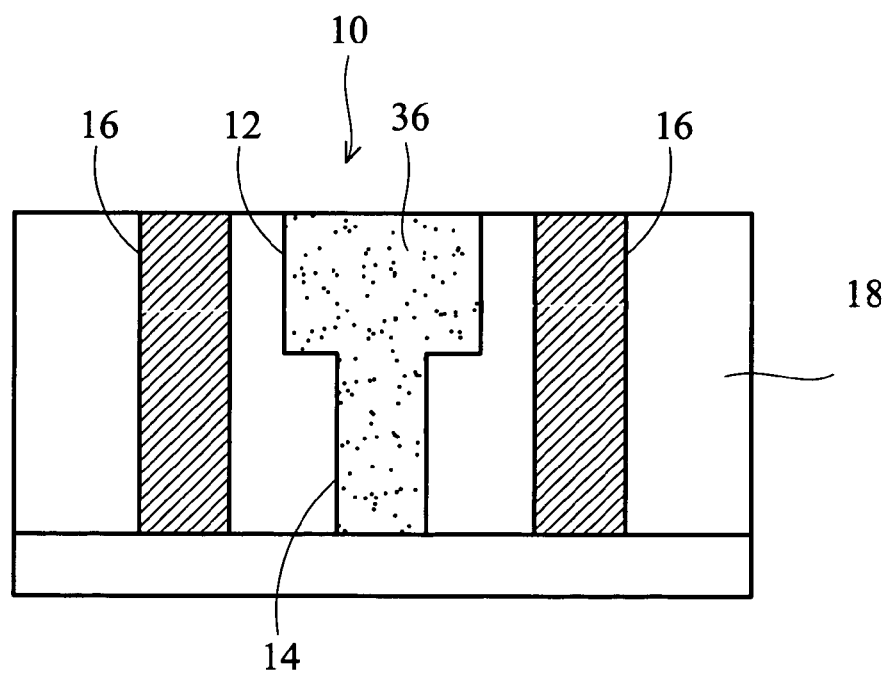
FIG. 1B is a cross-sectional view along line 1B-1B illustrating an exemplary embodiment of a dummy via design for a dual damascene structure.

Herein, a plane view of FIG. 1A illustrates an exemplary embodiment of a dummy via design, and FIG. 1B is a cross-sectional view along line 1B-1B of FIG. 1A to illustrate an exemplary embodiment of a dummy via design for a dual damascene structure. A dual damascene structure 10 includes an upper trench portion 12 and a lower via portion 14 which are inlaid in an inter-metal dielectric (IMD) layer 18 (e.g., a single dielectric material or dual dielectric materials with a middle etch stop layer) and filled with a conductive material 36 (e.g., copper-based metal or copper alloy). A dummy via design includes at least two dummy vias 16 filled with non-conductive materials (e.g., SOG, oxide, polymer or photoresist), which are inlaid in the IMD layer 18 and located laterally adjacent to the via portion 14. In one embodiment, the dummy via design provides two dummy vias 16 located at two sides of the via portion 14, respectively. In one embodiment, the dummy via design provides more than two dummy vias 16 located around each via portion 14, in which the dummy vias 16 may be arranged in a regular manner (e.g., line or array) or in a random manner. The dummy vias 16 may be separated from the via portion 14 with an appropriate distance allowed by a predetermined design rule. Although the embodiment of the present invention illustrates dummy vias 16 having an identical size, the present invention provides value when using dummy vias 16 having different features in dimension and shape.

FIGS. 2A to 2E are cross-sectional diagrams illustrating a via-first dual damascene process for forming the dummy vias according to one embodiment of the present invention.

Figure 2A:
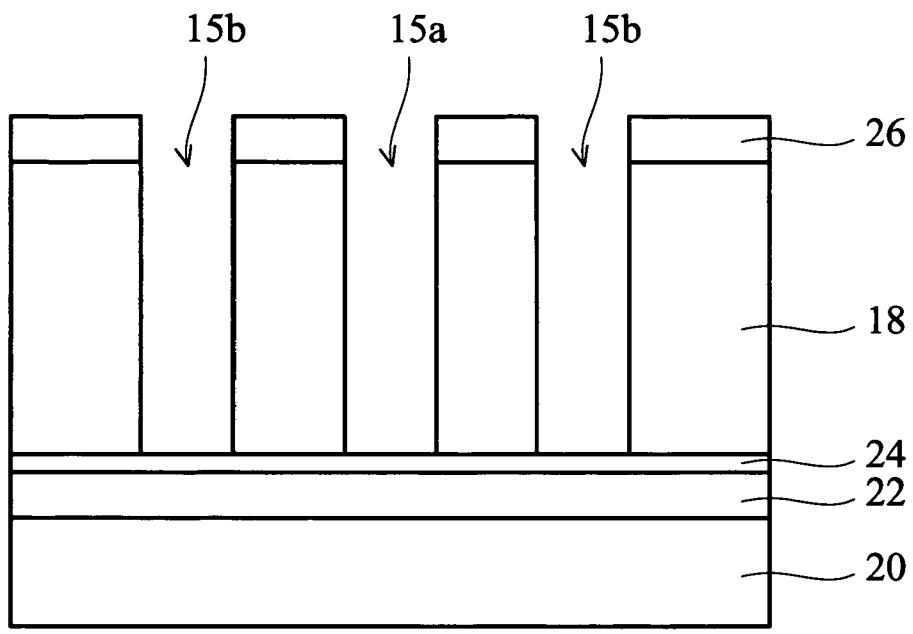
FIGS. 2A to 2E are cross-sectional diagrams to illustrate a via-first dual damascene process for forming the dummy vias according to one embodiment of the present invention.

In FIG. 2A, an example of a semiconductor substrate 20 used for interconnection fabrication is provided with a conductive region 22 patterned thereon. The semiconductor substrate 20 comprises a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuit having multiple individual circuit elements, such as transistors, diodes, resistors, capacitors, inductors, and other active and passive semiconductor devices. The integrated circuits are omitted in the drawings for clarity and convenience. The conductive region 22 is a portion of conductive routes. Suitable materials for the conductive region 22 may include, but is not limited to, for example copper, aluminum, copper alloy, or other mobile conductive materials. The conductive region 22 has exposed surfaces that may be treated by a planarization process, such as chemical mechanical polishing, if necessary. Optionally, an etch stop layer 24 may be deposited on the conductive region 22 through any of a variety of techniques, including, CVD, PECVD, PVD, and future-developed deposition procedures to provide a clear indicator of when to end a particular etching process. The etch stop layer 24 also reduces or eliminates resist scum, improve dielectric adhesion, and prevent dielectric peeling as well. Suitable materials for the etch stop layer 24 may include, but is not limited to, for example silicon carbide (SiC), silicon nitride, silicon oxynitride (SiON), silicon oxide, or combinations thereof.

Referring to FIG. 2A, the IMD layer 18 is then deposited on the etch stop layer 24. The IMD layer 18 reaches to a thickness of about 1000 angstroms to about 30000 angstroms through any of a variety of techniques, including, spin coating, CVD, and future-developed deposition procedures. The IMD layer 18 may be formed of $SiO_2$, carbon-doped $SiO_2$, and a comparatively low dielectric constant dielectric material with a k value less than about 4.0 (e.g., 3.5 or less), or combinations thereof. A wide variety of low-k materials may be employed, for example, spin-on inorganic dielectrics, spin-on organic dielectrics, porous dielectric materials, organic polymer or organic silica glass. The IMD layer 18 may be a single dielectric layer or a multiple dielectric structure having a middle etch stop layer interposed between dual dielectric materials. Optionally, an anti-reflective coating (ARC) layer 26 may be coated on the IMD layer 18 to provide a larger process window during a subsequent lithography step. The ACR layer 26 may be organic materials or inorganic materials (such as $SiO_2$ or SiON). A plurality of via openings 15a and 15b is then formed in the IMD layer 18 using a typical lithographic and anisotropic etching operation (e.g., plasma etching or reactive ion etching), and the etching operation may be stopped on the etch stop layer 24. In accordance with the dummy via design for the dual damascene structure shown in FIG. 1A, the first via opening 15a is patterned in position corresponding to the via portion 14, and the second via openings 15b are patterned in position corresponding to the dummy vias 16.

Figure 2B:
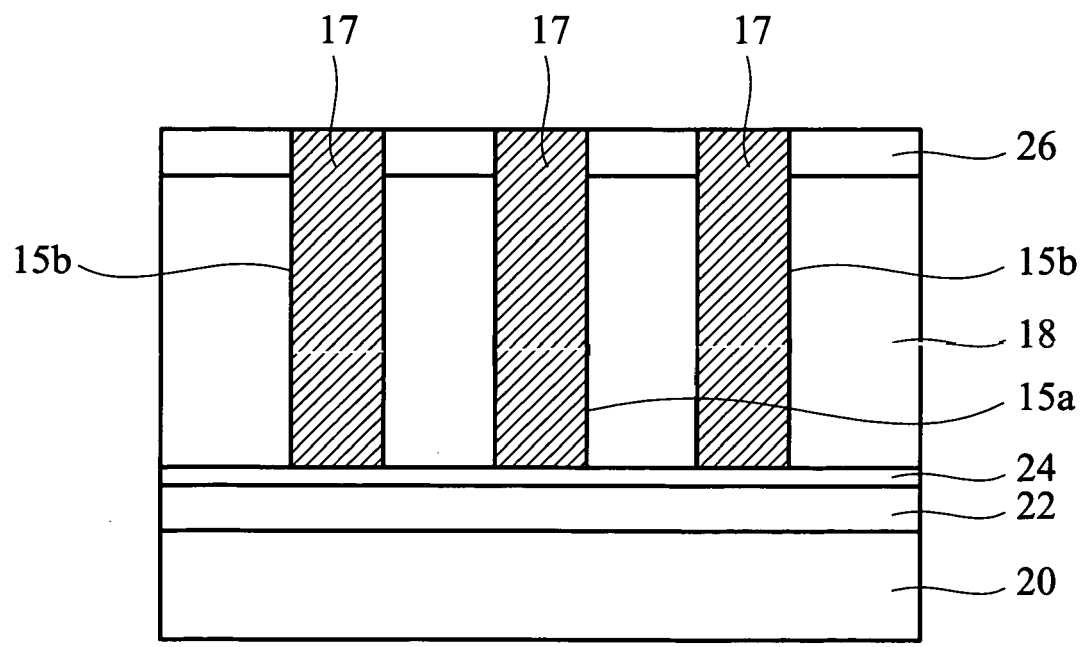

Referring to FIG. 2B, a filling material 17 is provided to completely fill the via openings 15a and 15b, resulting in non-conductive plugs embedded in the IMD layer 18. In order to obtain a satisfactory flatness, an etch back process may be further applied to level off surfaces of the filling material 17 and the ARC layer 26. The non-conductive plugs formed in the second via openings 15b therefore serve as dummy vias 16, while the filling material 17 in the first via opening 15a will be removed in subsequent patterning processes. The filling material 17 may be inorganic materials or organic materials depending on via-filling methods. In one embodiment, the via openings 15a and 15b are filled by using SOG (spin-on-glass) coating, in which liquid silicon compound is deposited and a heat treatment process is then performed to change the silicon compound into silicon oxide. In one embodiment, the via openings 15a and 15b are filled with TEOS-based dielectric through PECVD method. In one embodiment, the via openings 15a and 15b are filled with organic materials by spin coating with standard baking. Suitable organic materials may include, but is not limited to, organic bottom anti-reflective coating (BARC), photoresist formed from either a positive tone or negative tone photoresist, and sacrificial light absorbing material (SLAM).

Figure 2C:
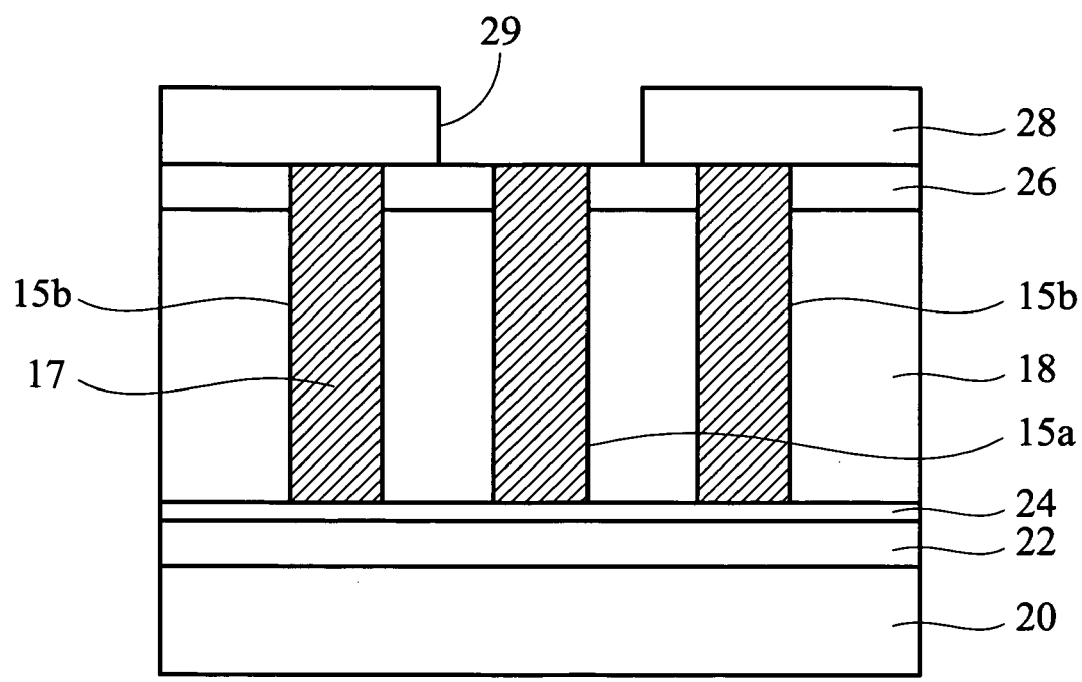
Figure 2D:
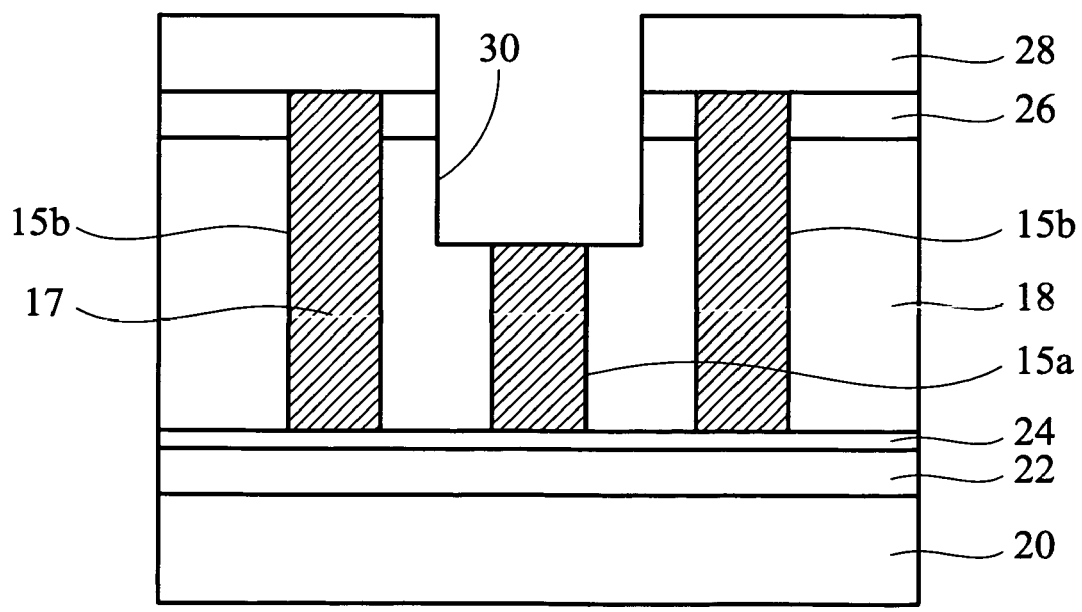

In FIG. 2C, a patterned photoresist layer 28, having an opening 29 corresponding to a trench feature, is provided on the ARC layer 26 to cover the dummy vias (referred to the second via openings 15b filled with the filling material 17). In FIG. 2D, advances in lithography and masking techniques and etch processes are employed to etch the exposed portions of the ARC layer 26, the IMD layer 18 and the filling material 17 to complete a trench opening 30 at the upper regions of the first via opening 15a. During the etch process through the IMD layer 18, the patterned photoresist layer 28 and the ARC layer 26 are typically consumed and the level of the filling material 17 in the via opening 15a is reduced.

Figure 2E:
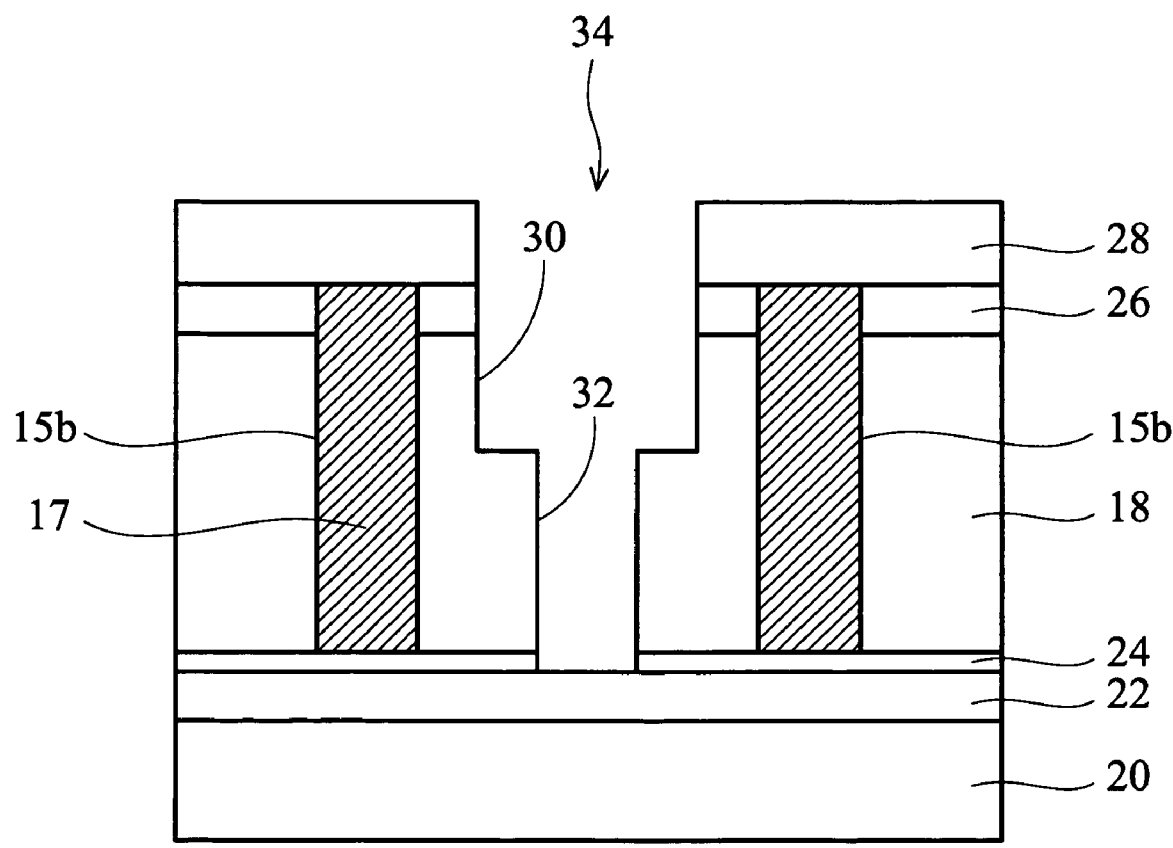

Finally, in FIG. 2E, the filling material 17 remaining in the lower region of the via opening 15a is stripped off in a wet solution, thus completing a via opening 32 underlying the trench opening 30. The etch stop layer 24 at the bottom of the via opening 32 is removed in a further etching process so as to exposed the underlying conductive region 22. The combination of the trench opening 30 and the via opening 32 forms a dual damascene opening 34 which will be filled with a conductive material 36 to become a dual damascene structure 10 including the trench portion 12 and the via portion 14 as shown in FIG. 1B. One embodiment of the present invention use copper-based conductive materials for forming the dual damascene structure. The copper-based conductive material is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium.

Accordingly, the present invention uses a dummy via design to alleviate proximity effects without the use of OPC technique for the via-first dual damascene process. This dummy via design affords an increased process window for the via patterning process.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A semiconductor device, comprising:
   a dielectric layer on a substrate;
   a dual damascene structure filled with a conductive material and inlaid in said dielectric layer; and
   a dummy via structure filled with an optical sensitive organic material and inlaid in said dielectric layer, wherein said dummy via structure comprises at least two dummy vias filled with said optical sensitive organic material and located adjacent to two sides of said dual damascene structure respectively.

2. The semiconductor device of claim 1, wherein said dummy vias are filled with an organic bottom anti-reflective coating.

3. The semiconductor device of claim 1, wherein said dummy vias are filled with a positive tone photoresist or a negative tone photoresist.

4. The semiconductor device of claim 1, wherein said dielectric layer has dielectric constant less than 4.0.

5. The semiconductor device of claim 1, wherein said dual damascene structure comprises an upper trench portion and a lower via portion, and said dummy vias are laterally adjacent to said lower via portion.

6. A semiconductor device, comprising:
   a dielectric layer on a substrate, having dielectric constant less than 4.0;
   a dual damascene structure filled with a conductive material and inlaid in said dielectric layer; and
   a dummy via structure filled with a TEOS(Tetraethyl Ortho silicate)-based dielectric material and inlaid in said dielectric layer, wherein said dummy via structure comprises at least two dummy vias filled with said TEOS-based dielectric material and located adjacent to two sides of said dual damascene structure respectively.

7. The semiconductor device of claim 6, wherein said dual damascene structure comprises an upper trench portion and a lower via portion, and said dummy vias are laterally adjacent to said lower via portion.

8. A semiconductor device, comprising:
   a dielectric layer on a substrate;
   a dual damascene structure filled with a conductive material and inlaid in said dielectric layer; and
   a dummy via structure filled with a sacrificial light absorbing material (SLAM) and inlaid in said dielectric layer, wherein said dummy via structure comprises at least two dummy vias filled with said SLAM and located adjacent to two sides of said dual damascene structure respectively.

* * * * *